(12) United States Patent
Luu et al.

(10) Patent No.: US 7,987,150 B1
(45) Date of Patent: Jul. 26, 2011

(54) METHOD AND APPARATUS FOR AUTOMATED RULE-BASED SOURCING OF SUBSTRATE MICROFABRICATION DEFECTS

(75) Inventors: Victor V. Luu, Morgan Hill, CA (US); John Poreda, Moraga, CA (US); Thieu Nguyen Trinh, HoChiMinh (VN); Phong Van Nguyen, HoChiMinh (VN); Luan Thien Dinh, HoChiMinh (VN); Khoa Pham Dang Truong, HoChiMinh (VN)

(73) Assignee: SIGLaz, Santa Clara, CA (US)

( * ) Notice: Subject to any disclaimer, the term of this patent is extended or adjusted under 35 U.S.C. 154(b) by 789 days.

(21) Appl. No.: 11/849,869

(22) Filed: Sep. 4, 2007

Related U.S. Application Data

(60) Provisional application No. 60/900,551, filed on Feb. 9, 2007.

(51) Int. Cl.
  *G06F 17/00* (2006.01)
  *G06N 5/02* (2006.01)
(52) U.S. Cl. .......................................................... 706/47
(58) Field of Classification Search ...................... 706/47
  See application file for complete search history.

(56) References Cited

U.S. PATENT DOCUMENTS

2007/0288185 A1* 12/2007 Burch et al. ..................... 702/81

OTHER PUBLICATIONS

Tyagi et al. "Defect Clustering Viewed Through Generalized Poisson Distribution", IEEE, SM, vol. 5, No. 3, 1992, pp. 196-206.*
Tobin et al. "Integrated applications of inspection data in the semiconductor manufacturing environment," in Metrology-based Control for Micro-Manufacturing, vol. 4275 of SPIE Proceedings, 2001, pp. 31-40.*
Lin "Parametric Wafer Map Visualization", IEEE Computer Graphics and Applications, 1999, pp. 1-4.*
Hugo A. D. do Nascimento et al. "Interactive graph clustering based on user hints", 2001, Lecturer of the Instituto de Informática, UFG—Brazil, 7 pages.*

* cited by examiner

*Primary Examiner* — Jeffrey A Gaffin
*Assistant Examiner* — Li-Wu Chang
(74) *Attorney, Agent, or Firm* — Fernandez & Associates, LLP

(57) ABSTRACT

Automated defect sourcing systems identify root-causes of yield excursions due to contamination, process faults, equipment failure and/or handling. They perform this function in timely manner and provide accurate and timely feedback to address and contain the sources of yield excursion. A signature repository stores known wafer surface manufacturing defect types as set of rules. The signature of a manufacturing defect pattern is associated with the equipment or process that causes the defects, and is used to source the manufacturing defects and to provide process control for changing and/or stopping yield excursion during fabrication. A defect signature rule-based engine matches wafer defects against the signature repository during wafer fabrication. Once the defect signature is detected during fabrication, handling and/or disposing the root-cause of the corresponding defect is facilitated using messages according to an event handling database. Optionally, a real-time process control for wafer fabrication is provided.

26 Claims, 21 Drawing Sheets

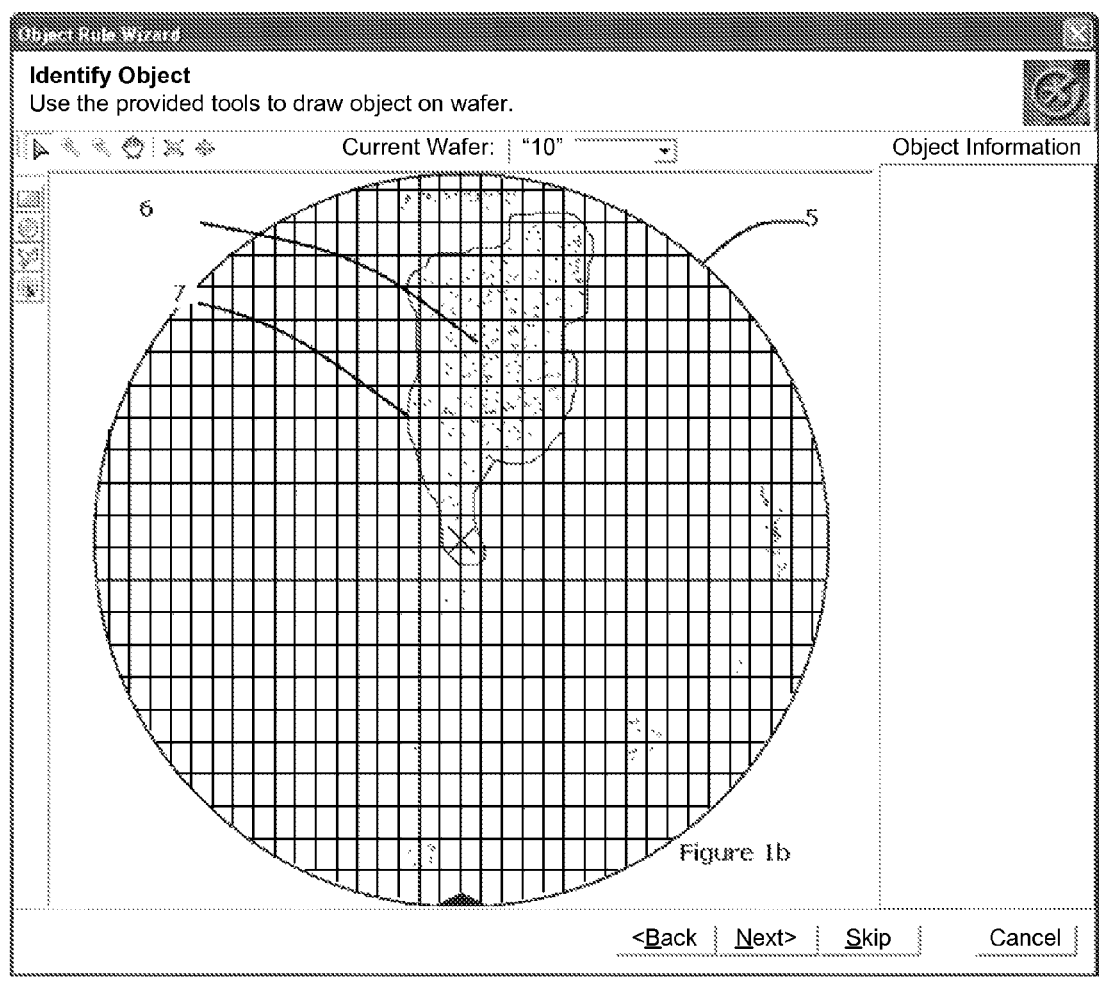

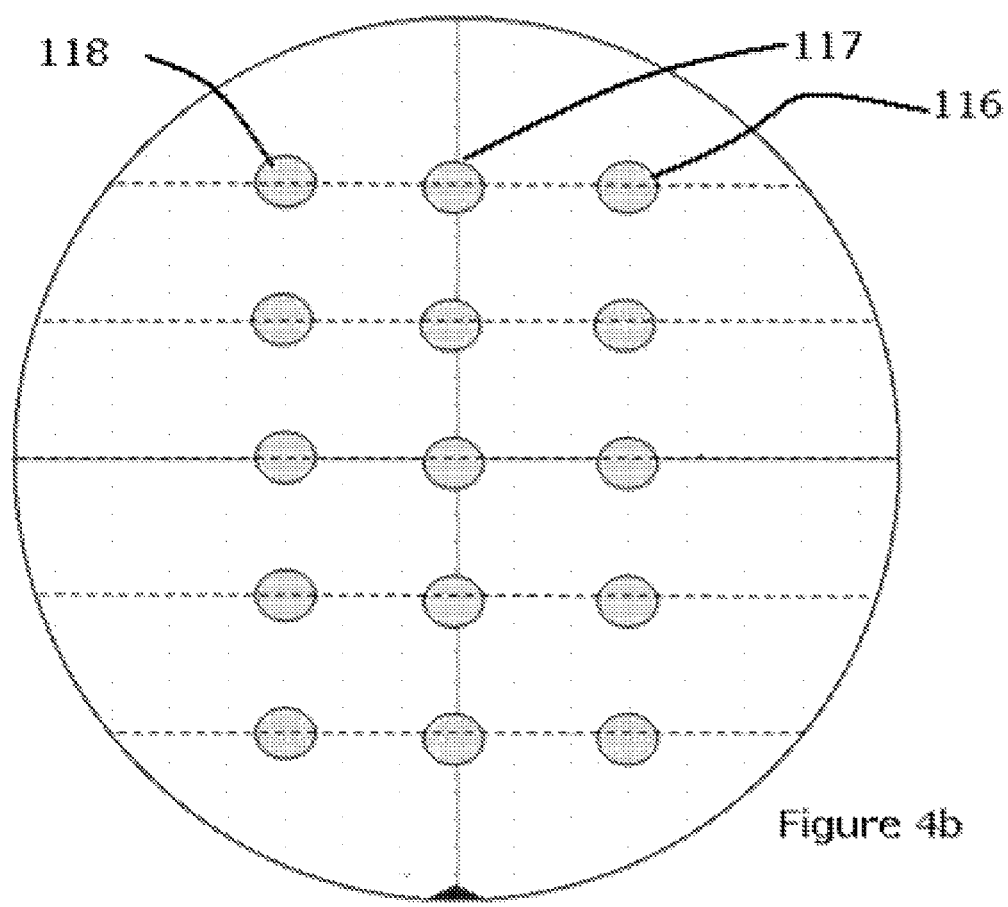

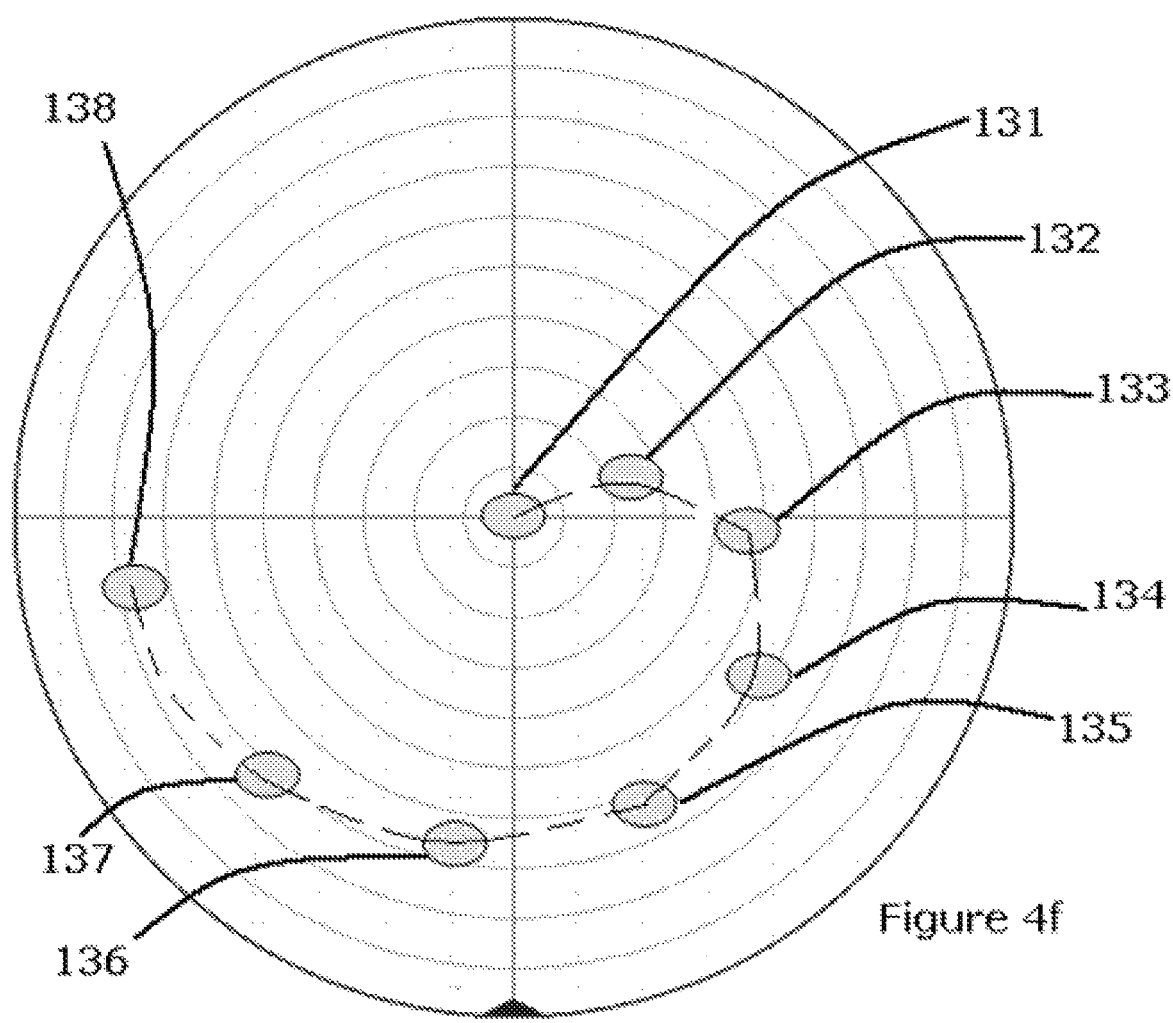

METHOD AND APPARATUS FOR AUTOMATED RULE-BASED SOURCING OF SUBSTRATE MICROFABRICATION DEFECTS

CROSS REFERENCE TO RELATED APPLICATIONS

This application claims priority to U.S. Provisional Patent Application No. 60/900,551, entitled "Method and apparatus for automated sourcing of substrate microfabrication defects using rule-based approach" filed on Feb. 9, 2007, which application is incorporated herein by reference in its entirety.

BACKGROUND

1. Field

The present invention relates to detection of semiconductor fabrication defects, and in particular to a method and apparatus for automatic rule-based semiconductor fabrication defect signature recognition and defect sourcing.

2. Related Art

Conventional semiconductor fabrication systems incorporate clustering methods to group defects detected on a wafer surface that have commonality in position, size, or orientation into clusters. Drawbacks of this approach include: (a) clustering technique is primitive, and measurable attributes are not accurate enough to be used in a rule-based approach to identify defect patterns; (b) attributes extracted from clusters are insufficient for formulating a mathematical model for rule-based manipulation; and (c) successful defect sourcing depends on expert know-how that is difficult to capture.

Accordingly, there is need for (a) a mathematical model to capture the defect clusters, (b) automatic capture of measurable attributes like position, size, orientation, density and others, and (c) self-learning semiconductor fabrication defect signature recognition and sourcing algorithms using a rule-based approach for addressing the above problems.

SUMMARY

An automated defect sourcing system identifies the root-cause of process excursions due to contamination, process faults, equipment failure and/or handling. The system analyzes defect data in timely manner and provides accurate timely feedback to address and contain the sources of yield excursions. A signature repository stores descriptions of known wafer surface manufacturing defects as set of rules. The signature of a manufacturing defect pattern is associated with a type of equipment or process, and is used to source the manufacturing defects and to provide process control for changing and/or stopping yield excursions during fabrication. A defect signature rule-based engine matches the data in a wafer defect inspection file against the set of rules in the signature repository during wafer fabrication. Once the defect signature is detected during fabrication, handling and/or disposing the root-cause of the corresponding defect signature is facilitated using messages according to an event handling database. Optionally, a real-time process control for wafer fabrication is provided.

BRIEF DESCRIPTIONS OF DRAWINGS

The drawings illustrate the design and utility of embodiments of the present invention, in which similar elements are referred to by common reference numerals. In order to better appreciate the advantages and objects of the embodiments of the present invention, reference should be made to the accompanying drawings that illustrate these embodiments. However, the drawings depict only some embodiments of the invention, and should not be taken as limiting its scope. With this caveat, embodiments of the invention will be described and explained with additional specificity and detail through the use of the accompanying drawings in which:

FIG. 1b shows an example of defects on a wafer defect map, according to an embodiment of the present invention.

FIG. 4b shows a group of defect clusters sharing the same row topology, according to an embodiment of the present invention.

FIG. 4f shows a group of defect clusters sharing the same spiral topology, according to an embodiment of the present invention.

DETAILED DESCRIPTION

Figure 1:
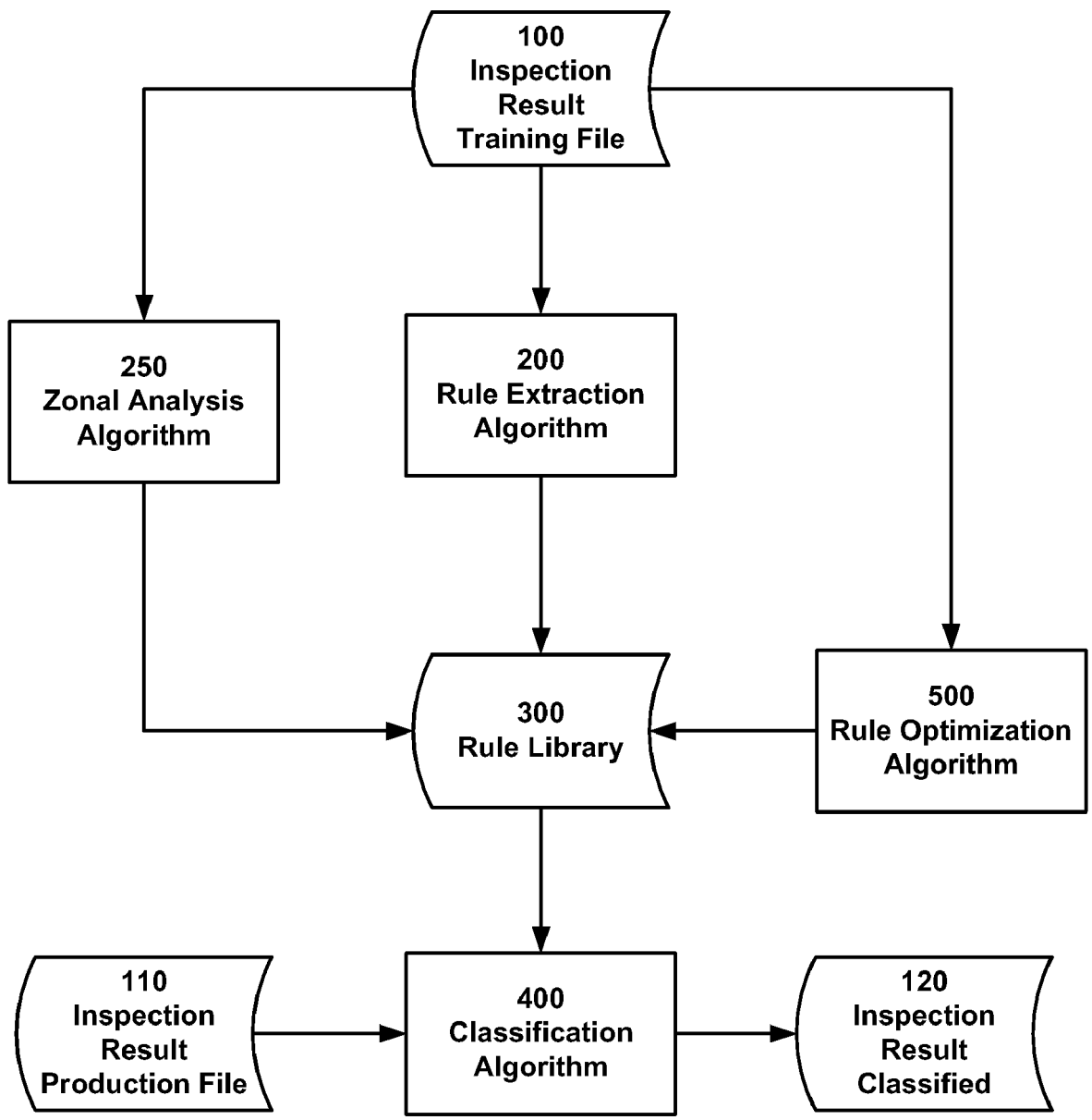
FIG. 1 is a flow diagram illustrating a rule-based method for defect sourcing, according to an embodiment of the present invention.

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The following definitions serve as a glossary of terms as used herein:

Defect: A pit, tear, groove, inclusion, grain boundary, or other surface feature anomaly that is either characteristic of the material or a result of its processing and that is not a result of the sample preparation. Examples include: particle deposited on substrate; scratch or streak on wafer; lithographic error; non-uniform deposition, etch or planarization; excessive or inadequate deposition, etch or planarization; etc.

Defect Cluster: A grouping of defects detected on a wafer surface that have commonality in position, size, orientation and/or one or more other measurable attributes.

Scratch: On semiconductor wafers, a shallow groove or cut below the established plane of the surface, typically with a length to width ratio greater than approximately 5:1. [ASTM F1241]

Scratch cluster: A grouping of concentrated defects that comprises a scratch and spans multiple dies. When an envelope is drawn around the scratch cluster, the envelope shape is generally elongated; however, the position and orientation of the cluster is such that it is not radial or annular. There are two types of scratch clusters: random and patterned.

Patterned scratch: A classification of scratch defect clusters. Patterned scratches comprise multiple scratch clusters that are arranged in a recognizable pattern.

Annular Defect Cluster: A grouping of distributed defect clusters. Annular clusters are distributed in a ring pattern with approximately equal distance from the center of the wafer. An annular cluster may comprise two or more rings (e.g. a "bull's eye").

Radial Defect Cluster: A grouping of distributed defects. Radial clusters are distributed along lines emanating from the center of the wafer. A radial signature may also include a concentration of defects in the center of the wafer. Starfish clusters are examples of radial clusters.

Zonal Defect Cluster: A grouping of distributed defects that span multiple dies. Zonal clusters are the least well-defined; they may be characterized by location, shape, orientation, density distribution and relationship to other clusters. There are two classifications of zonal defect clusters: fixed position and floating.

Inspection Equipment: Equipment used by a manufacturer to identify defects, artifacts and/or anomalies on a substrate surface and/or below a substrate surface. Inspection equipment may be stand-alone or integrated into the process equipment (i.e. in situ).

Metrology Equipment: Equipment used by manufacturers to measure topography, morphology, film thickness and/or other physical attributes of the substrate surface and/or attributes that appear below the substrate surface. Metrology equipment may be stand-alone or integrated into the process equipment (i.e. in situ).

Results File: The output file (such as a text file, digital image file or wafer defect map) from the inspection equipment or the metrology equipment. Inspection equipment results files define or indicate the coordinate location, size, type and/or other attributes of defects, artifacts or anomalies. Examples include KLA™ results files, Scanning Electron Microscope images, wafer bin maps, digital images of wafer surface, etc. A metrology equipment results file indicates physical attributes at various points over the wafer surface. Examples are film thickness uniformity maps, wafer reflectivity maps, etc.

Wafer Defect Map or Substrate Defect Map: A display of defect information corresponding to defect coordinate locations on the wafer or substrate surface.

Defect Signature: A pattern or collection of patterns that are consistently created by a degradation, excursion or malfunction in a specific manufacturing process step.

Die stack: Wafer inspection data from multiple dies and/or multiple wafer files overlaid onto a single die grid. The purpose of creating a die stack is to identify systematic problem areas within the die.

Reticle stack: Wafer inspection data from multiple reticles and/or multiple reticle files overlaid onto a single reticle grid. The purpose of creating a reticle stack is to identify systematic problem areas within the reticle.

Hot spot: A region of the wafer or die, which contains a disproportionately high percentage of defects.

FIG. 1 is a flow diagram illustrating a rule-based method for defect signature sourcing, as well as its inputs and outputs. One or more result files 100 are used in process 200 to define or extract features of spatial defect clusters. The features are then used to manually or automatically build a set of rules 300. These rules are used in process 400 to classify spatial defect signatures. One or more result files 100 are used in process 250 to manually define or automatically derive a set of rules based on a zonal analysis of the surface of the wafer defect map. Process 400 will read in one or more inspection result files during wafer fabrication processing steps, classify the spatial signatures according to the set of rules in library 300, and output one or more classified defect result files 120. To gain a high accuracy rate in classification step 400, process step 500 is used to optimize the spatial signature recognition rules in library 300.

Figure 1A:
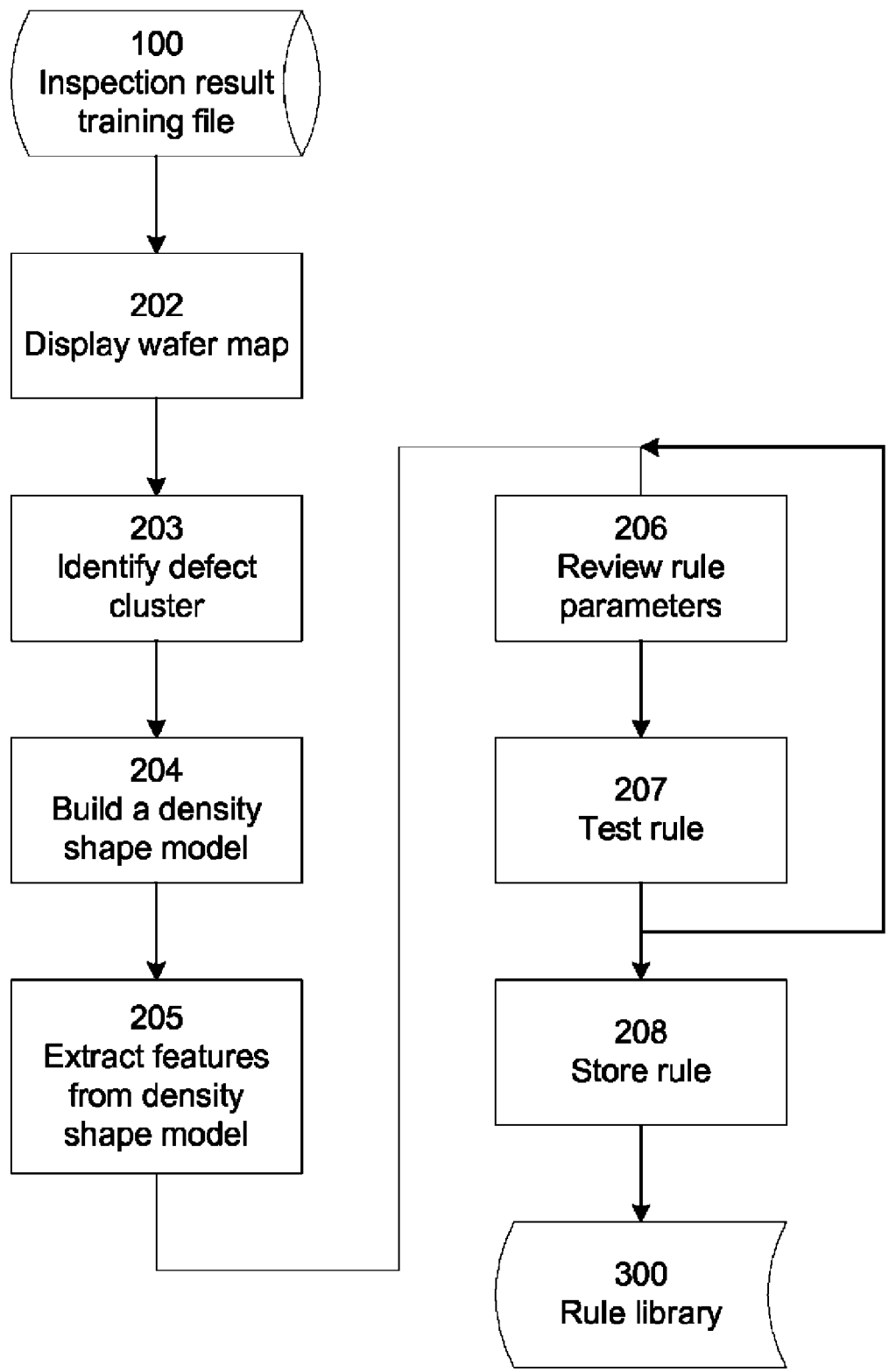
FIG. 1a is a flow diagram illustrating a method for rule extraction, according to an embodiment of the present invention.

FIG. 1*a* is a flow diagram illustrating a method for rule extraction and generation. The rule is then stored in the object library. The rule extraction process 200 is described in terms of a graphical user interface (GUI), operating within a graphical computer operating system. FIG. 1*b* shows an example of defects 6 on a wafer defect map 5.

At step 202, a GUI displays a wafer defect map 5 showing defects 6 to a defect engineer or other user. Upon visual inspection of the wafer map, the user perceives a defect cluster that can serve as a signature. At step 203, the user identifies a defect cluster through a trial and error process of adjusting density and distance parameters, as described below, until the cluster defined by the parameters sufficiently approximates the perceived defect cluster that is to serve as a signature. Once the density and distance parameters are adjusted to identify a defect cluster, a mathematical density shape model is produced to approximate the perceived defect cluster that is to serve as a signature. These steps are described in more detail below.

Figure 1C:
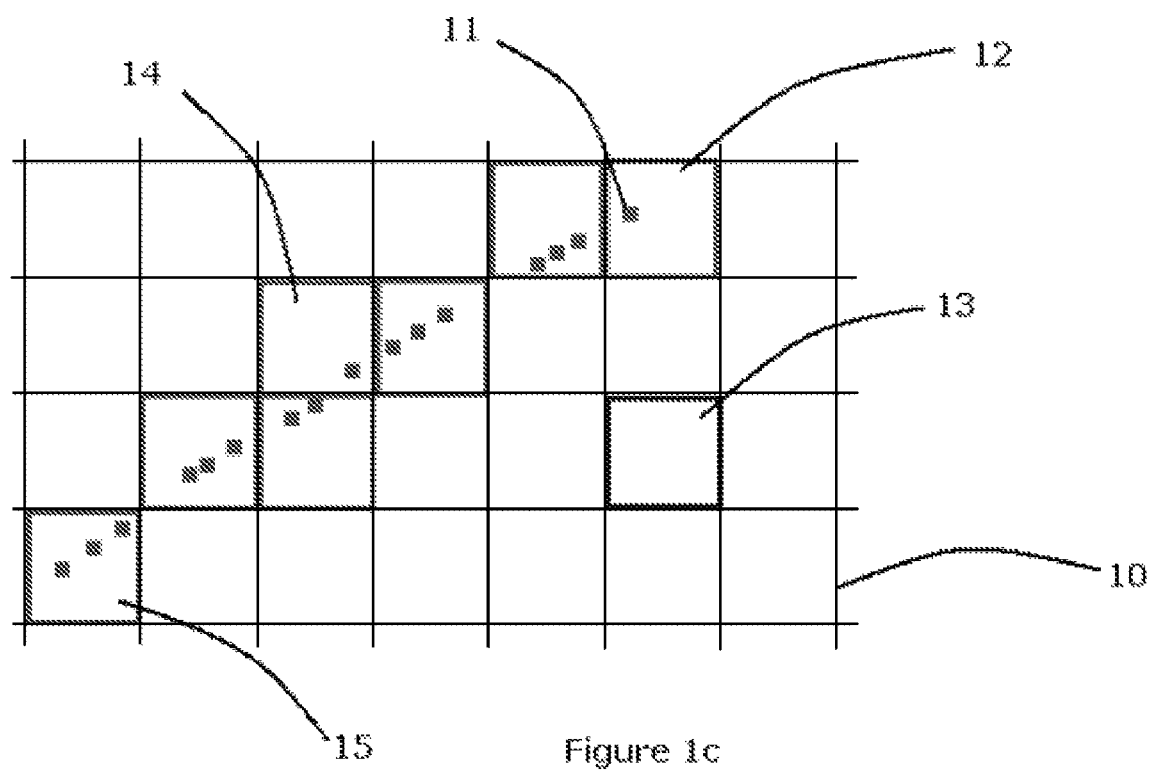
FIG. 1c shows an enlargement of a portion of a wafer defect map, showing defects that share spatial proximity, with a virtual grid superimposed on the defects, according to an embodiment of the present invention.

FIG. 1c shows an enlargement of a wafer defect map, showing defects that share spatial proximity, with a virtual grid 10 superimposed on the defects 11. The user adjusts density and distance parameters which result in grouping active cells (such as cells 12, 14 and 15, hereinafter also called units) into a cluster based on spatial proximity. The wafer defect map is divided into a virtual grid 10 where the grid cells may be measured in microns or nanometers depending on the application or resolution of the spatial signature.

An active cell is defined as one having at least one defect 11 within the virtual grid cell. An empty cell 13 is defined as having no defect in the virtual grid cell. A cluster is formed when active cells share spatial proximity in cell neighbor distance (a cell is considered to have a cell neighbor distance of one to each of its eight surrounding neighbor cells).

Figure 1D:
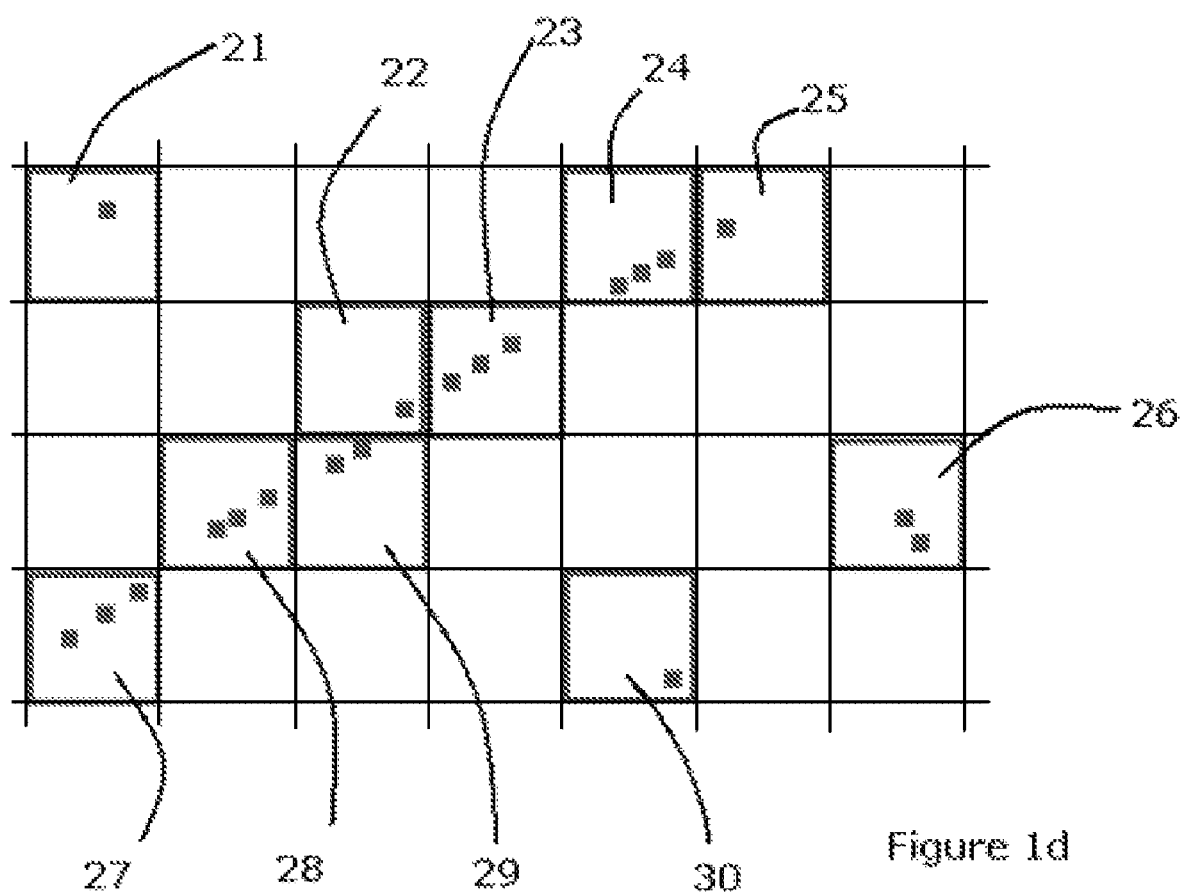
FIG. 1d shows active units within the superimposed virtual grid that may be grouped into a cluster, according to an embodiment of the present invention.
Figure 1E:
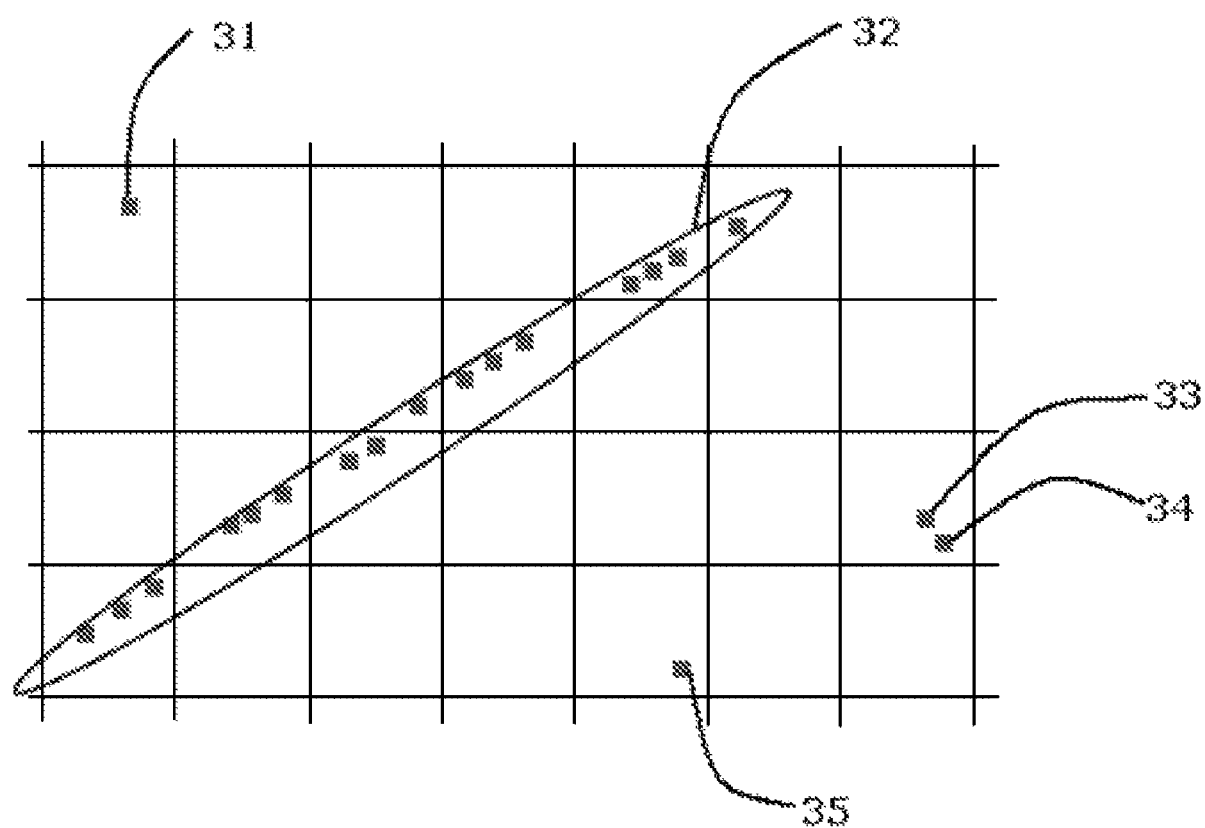
FIG. 1e shows a cluster of defects that share spatial proximity, according to an embodiment of the present invention.

For example, FIG. 1d shows that active cells 22, 23, 24, 25, 27, 28 and 29 within the superimposed virtual grid are grouped into a cluster of cells that have a cell neighbor distance of one. Active cells 21, 26 and 30 are not part of the cluster because the cell neighbor distance to the nearest active cell is greater than one and the rule for the cluster is defined to be equal to one. FIG. 1e shows an example cluster 32 with a neighbor distance of one, with individual defects 31, 33, 34 and 35 not considered to be part to the cluster 32.

In general, a user specifies distance and density parameters and views a wafer map together with the clusters, defined by the parameters, superimposed thereon. Such clusters are hereinafter also referred to as "primitive clusters." The user then goes through an iterative trial-and-error process of adjusting the density and distance parameters of the primitive clusters until they best agree with the defect cluster signature that the user desires to capture. In an alternative embodiment, a GUI allows the user to draw a boundary around the perceived defect cluster that is to serve as a signature, and the computer searches for distance and density parameter values that approximate the defect cluster.

At that point, the density and distribution of defects within the primitive clusters are used to formulate one or more mathematical density shape models for the primitive clusters. Such density shape models represent approximations of the density characteristics of the primitive clusters. An advantage of working with such mathematical approximations is that they comprise a set of parameters (described below) which form a more concise basis for defining rules that describe defect clusters.

As an example, a density shape model may be a best-fit ellipse which has the same second moment as an individual cluster, as shown by the following equation:

$$\int\int_E xy\,dx\,dy = \sum_P \omega_x(p_i)\omega_y(p_i)x_{p_i}y_{p_i} \qquad \text{(Equation 1)}$$

wherein
$x_p$, $y_p$ are the coordinates of the points $p_i \epsilon P$ in the cluster;
$\omega_x(p_i)$, $\omega_y(p_i)$ are the weight functions by x and y coordinates of point $P_i$;
E is the best-fit ellipse.

This best-fit ellipse E has the center at the mass-center $(x_0, y_0)$ of the cluster and has the same central second moment as the cluster, as shown by the following equation:

$$\int\int_E (x-x_0)(y-y_0)\,dx\,dy = \qquad \text{(Equation 2)}$$
$$\sum_P \omega_x(p_i)\omega_y(p_i)(x_{p_i}-x_0)(y_{p_i}-y_0)$$

Figure 2A:
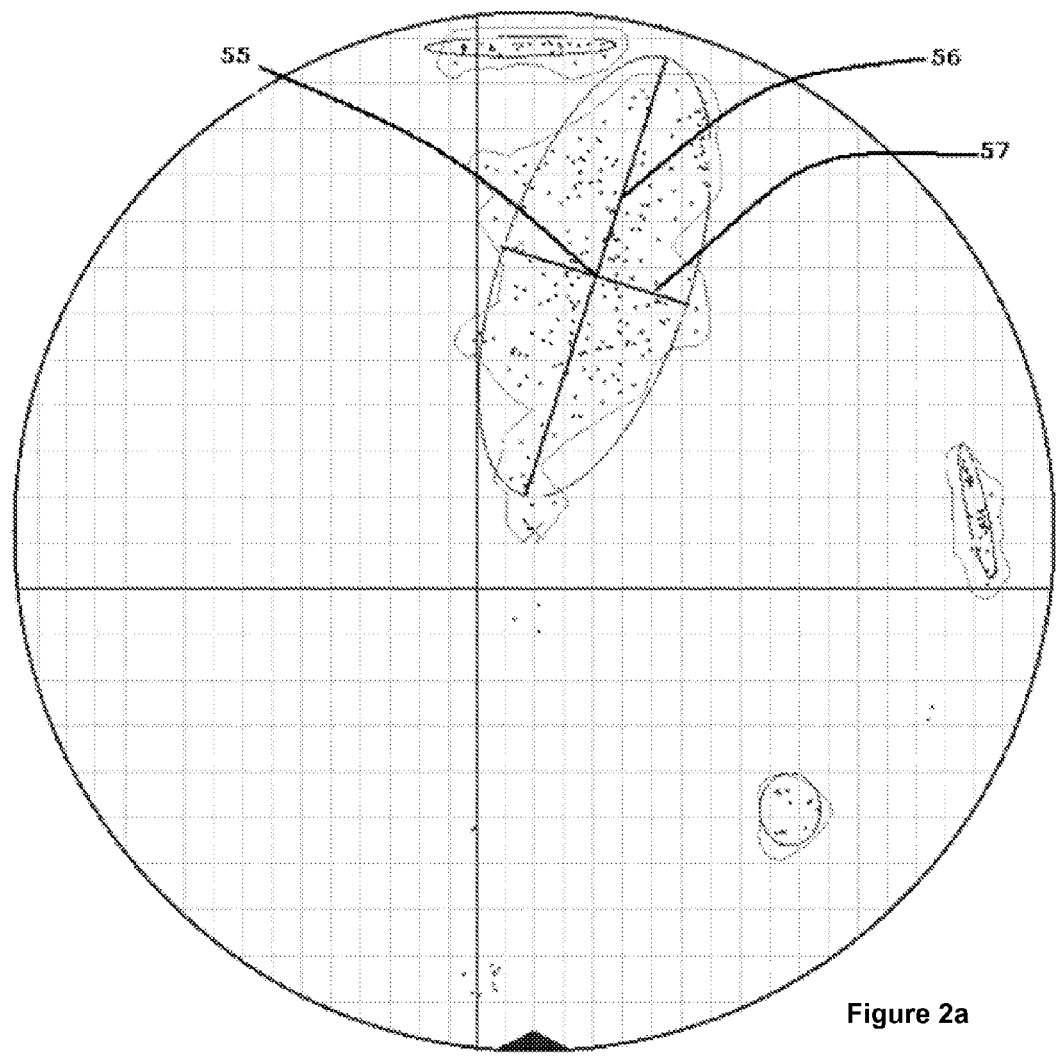
FIG. 2a shows some basic features of an ellipse density model represented by a spine or major axis, a width or minor axis, and a centroid, according to an embodiment of the present invention.
Figure 2B:
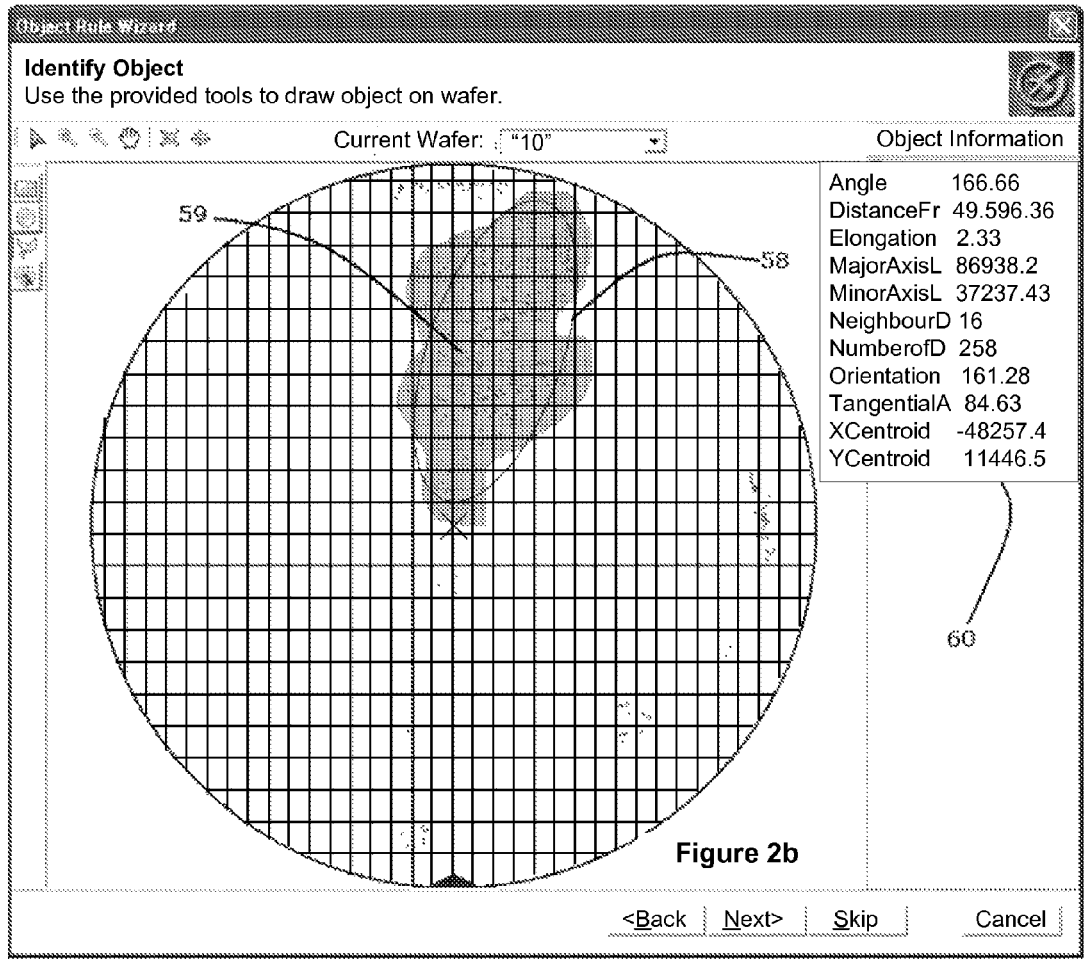
FIG. 2b shows a graphical user interface with an ellipse density model superimposed on a defect cluster contour, according to an embodiment of the present invention.
Figure 2C:
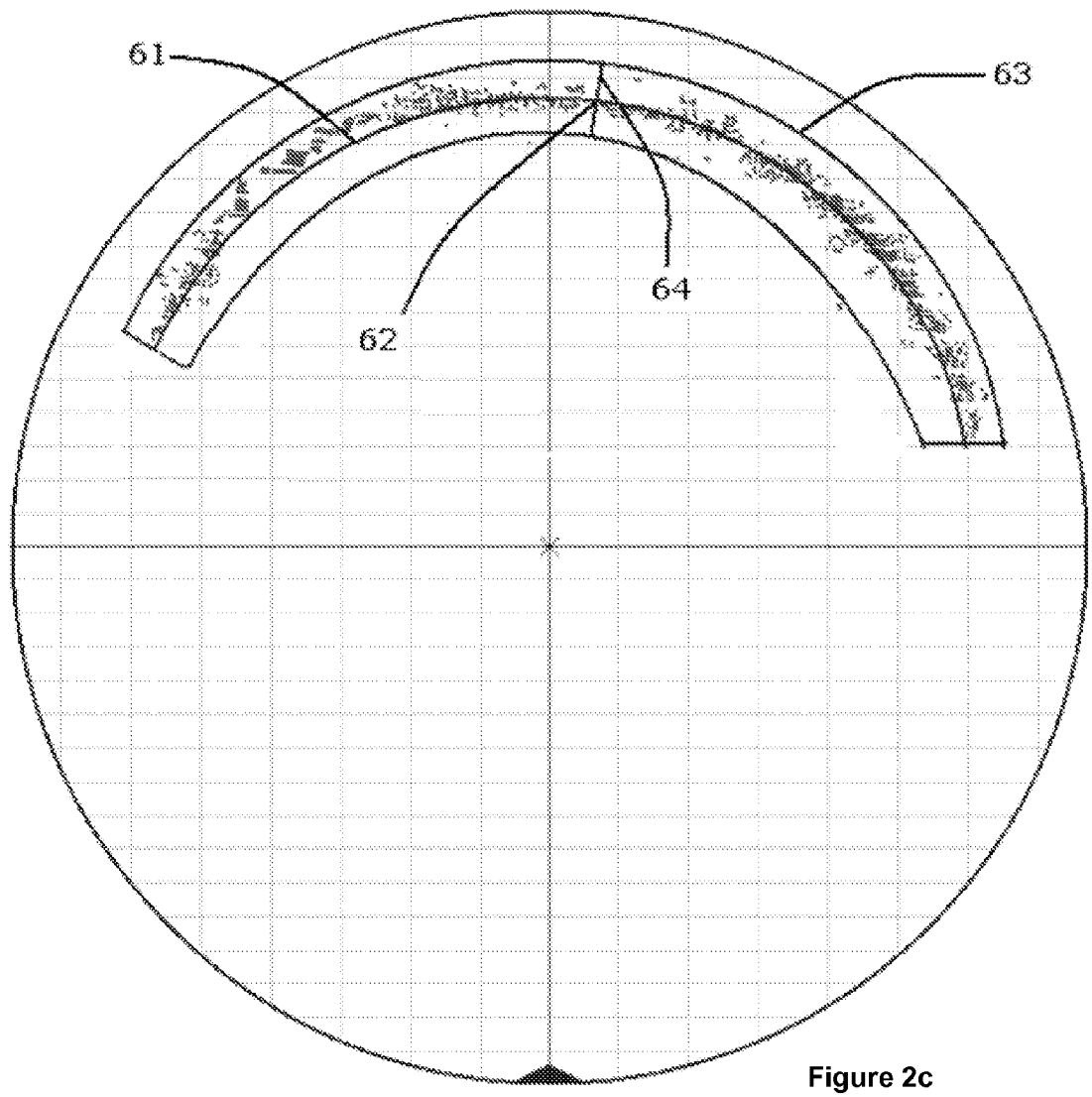
FIG. 2c shows a curved tube density model superimposed on a defect cluster, according to an embodiment of the present invention.
Figure 2D:
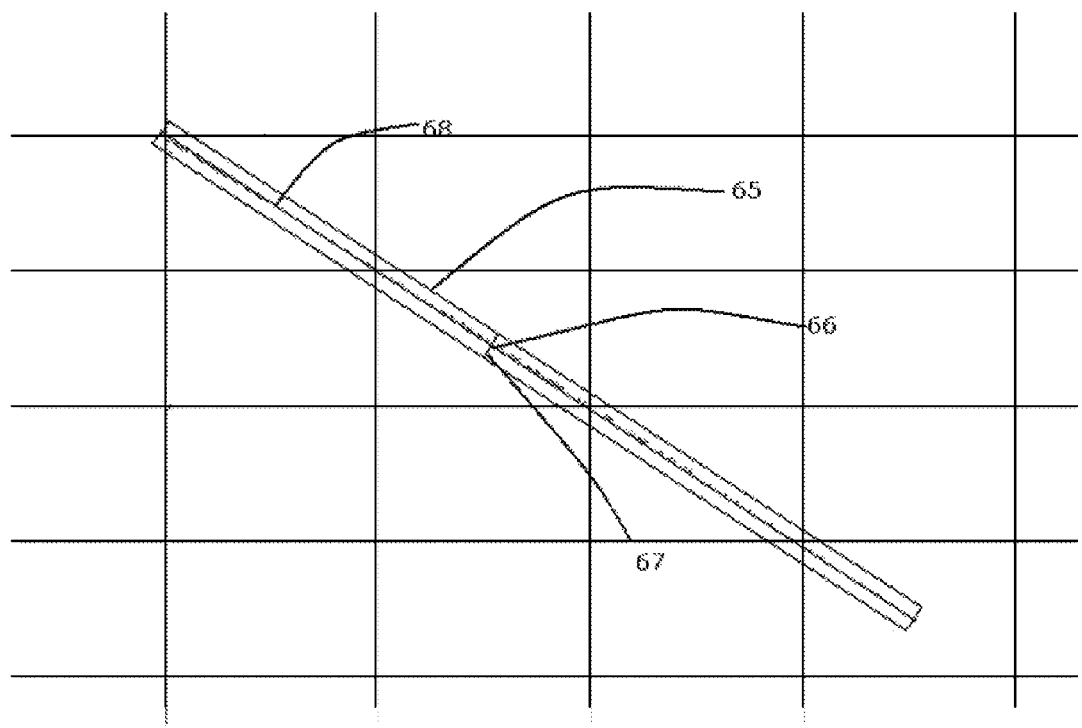
FIG. 2d shows a rectangle density model superimposed on a defect cluster, according to an embodiment of the present invention.
Figure 2E:
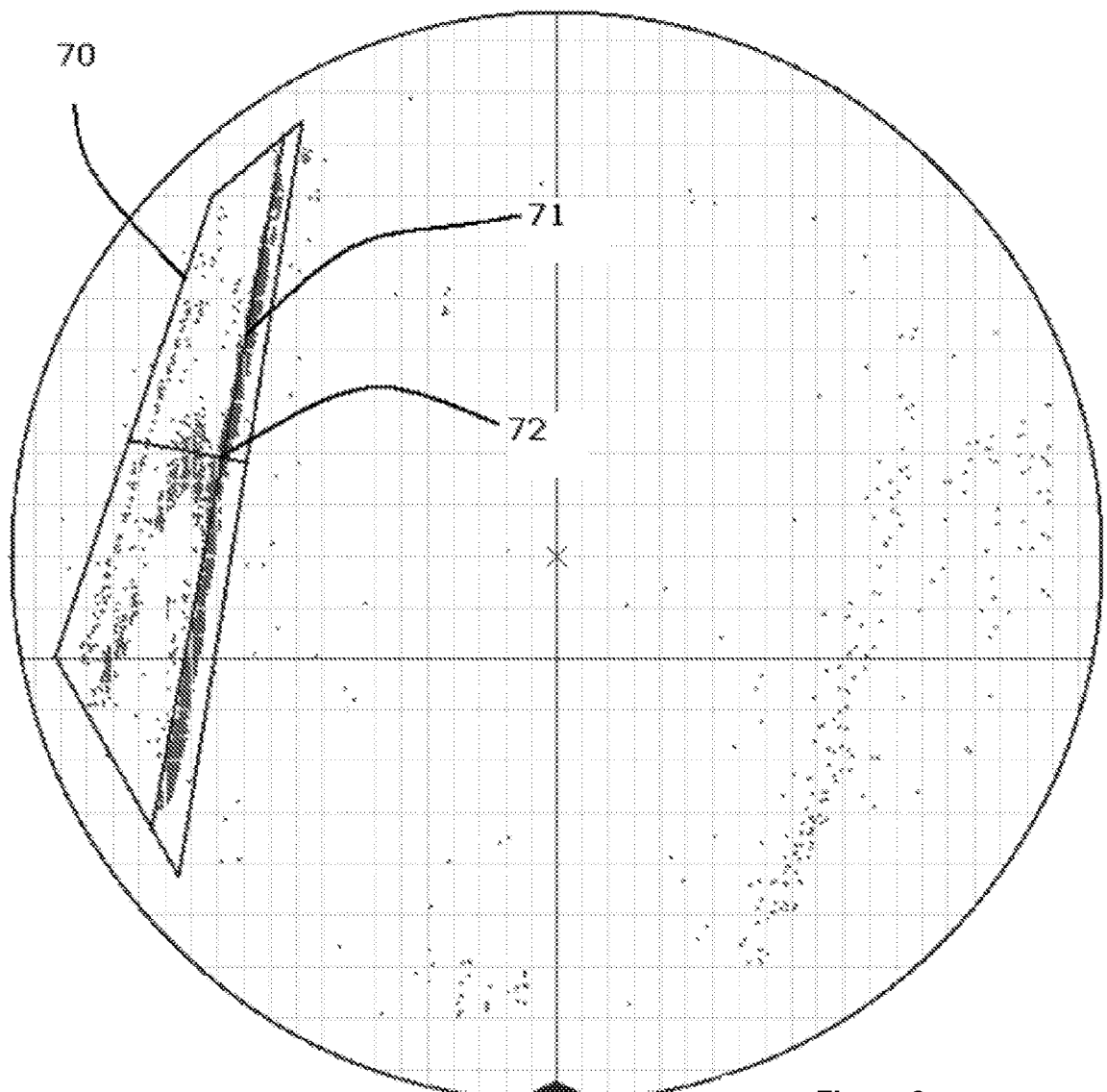
FIG. 2e shows a polygon density model superimposed on a defect cluster, according to an embodiment of the present invention.

In the example shown in FIG. 1e the density shape model is an ellipse. FIG. 2a shows basic features of an ellipse density shape model represented by a spine 56 or major axis, a width 57 or minor axis, and a centroid 55. FIG. 2b shows a graphical user interface with an ellipse density shape model 58 superimposed on the defect cluster contour 59. Note that the density shape model is not limited to an ellipse density shape model, and other shapes are possible as would be apparent to one skilled in the art. FIGS. 2a, 2c, 2d and 2e are models that share the following features:

a) Centroid 55, 62, 66, 72
 b) Spine 56, 61, 68, 71
 c) Cross section width 57, 62, 67, 72
 d) Cross section symmetry. This may be symmetric 57, 64, 67 or asymmetric 72.
 e) Degree curvature of spine. This may be straight 56, 68, 71 or curved 61.
 f) The change of cross section as a function of sweep. This may be constant 62, 67, expanding 72, contracting, expanding then contracting 57, or contracting then expanding.
 g) The convex set is defined as any nonempty defect cluster (S) in which a line segment joining any two points in S always lies entirely within S. The shaded sets in FIGS. 2g (101), (102), (103), (104), (105) and (106) are convex sets. The shaded sets in FIGS. 2g (107), 108 and (109) are not convex sets, since a line can be drawn, joining the indicated points within the set, which does not lie entirely within the set.

Figure 2F:
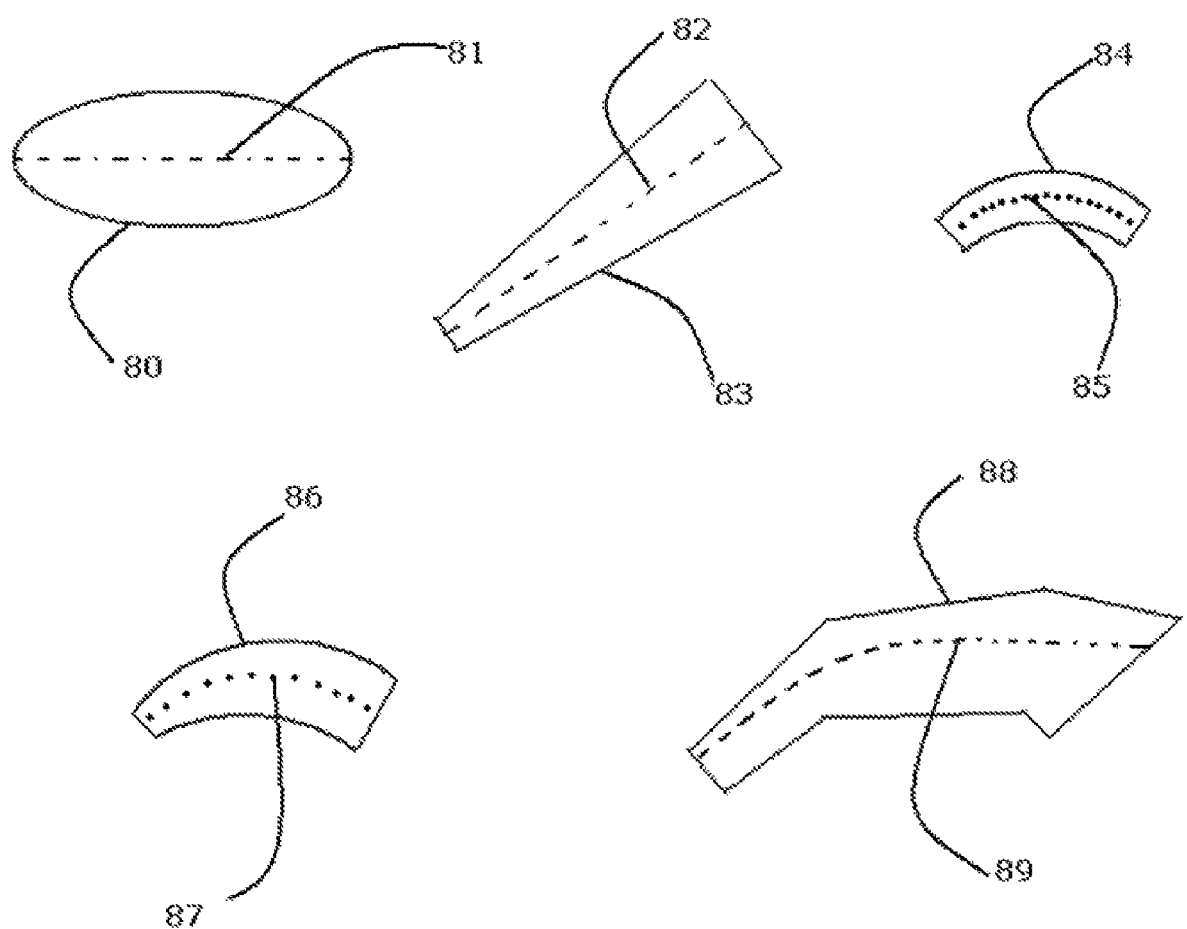
FIG. 2f shows several density model shapes for clustering defects, according to an embodiment of the present invention.
Figure 2G:
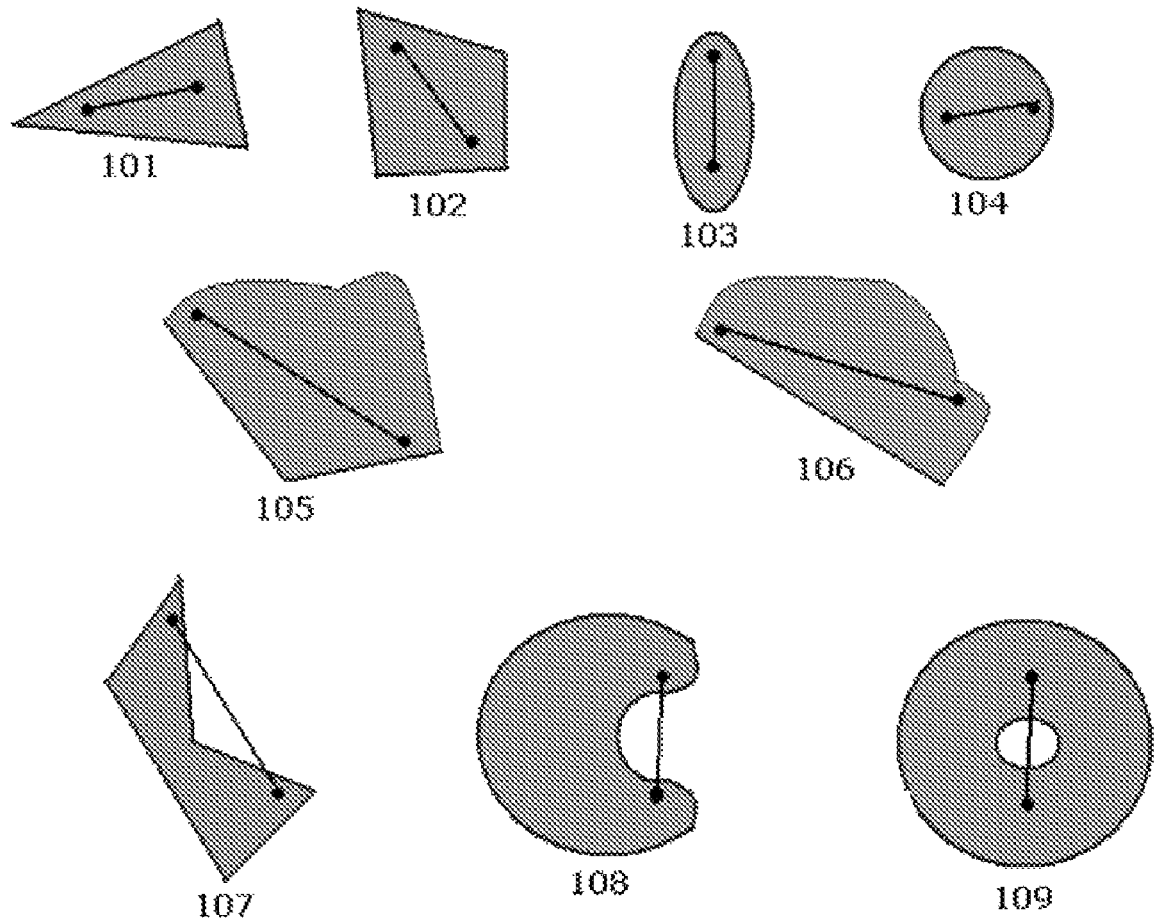
FIG. 2g shows convex and non-convex clusters, according to an embodiment of the present invention.

FIG. 2f shows examples of feature shapes where 81 and 82 have straight spines, 85, 87 and 89 have curved spines, 80, 83, 85 and 86 have cross-section symmetrical reflection, and 88 has asymmetrical reflection.

An advantage of using density shape models is the subsequent ability to express the primitive clusters in a more high-level manner in terms of the mathematical parameters of the density shape model, such as the ratio of the minor and major axes in an ellipse, angle of orientation of the major axis of an ellipse, etc. Therefore, after one or more density shape models 80 are created for a cluster, step 205 extracts the spatial features of the individual density shapes in order to describe the defect cluster, such as described in the following:

a) Location of the density shape model on the wafer defect map, for example expressed in angle degrees relative to the wafer notch.
 b) Location of the density shape model on the wafer defect map in micron units, relative to the position of the center of the wafer defect map or as a function of the radius of the wafer.
 c) Orientation of the density shape spine in angle degrees, relative to the axis of the wafer.
 d) Tangential angle of the density shape spine in degrees as a function of the radius of the wafer.
 e) Elongation of the density shape model as a function of the major and minor axes.
 f) Roundness of the density shape model as a function of the shape.
 g) Density and distribution uniformity of the defects within the cluster boundary.

h) Texture of the defect distribution with the cluster boundary.

While the above flow diagrams describe a simple process of extracting parameters from primitive clusters, it is also possible to extract parameters from complex clusters (i.e. cluster combinations) by repeating steps 204 and 205 and using rules to combine similar clusters according to topological similarity or other parametric similarity. Once a set of clusters are combined in this manner, the above described process of generating density shape models can be repeated to generate density shape models of a higher level describing the complex clusters. The user can then generate rules based on the mathematical parameters of such higher level density shape models in an effort to more concisely capture a given defect cluster that is described by a complex combination of primitive clusters. The rules can be generated to combine clusters based on parameters such as the clusters' linearity, proximity, density, radial position, horizontal or vertical position, etc. As one example, a series of three ellipses in a particular triangle formation may form a complex cluster. As another example, a series of four ellipses in a line formation may form a complex cluster. In general, any combination of density shape models can be used to form a complex cluster. Furthermore, this iteration is not limited to two levels, but can be repeated as desired.

Figure 4A:
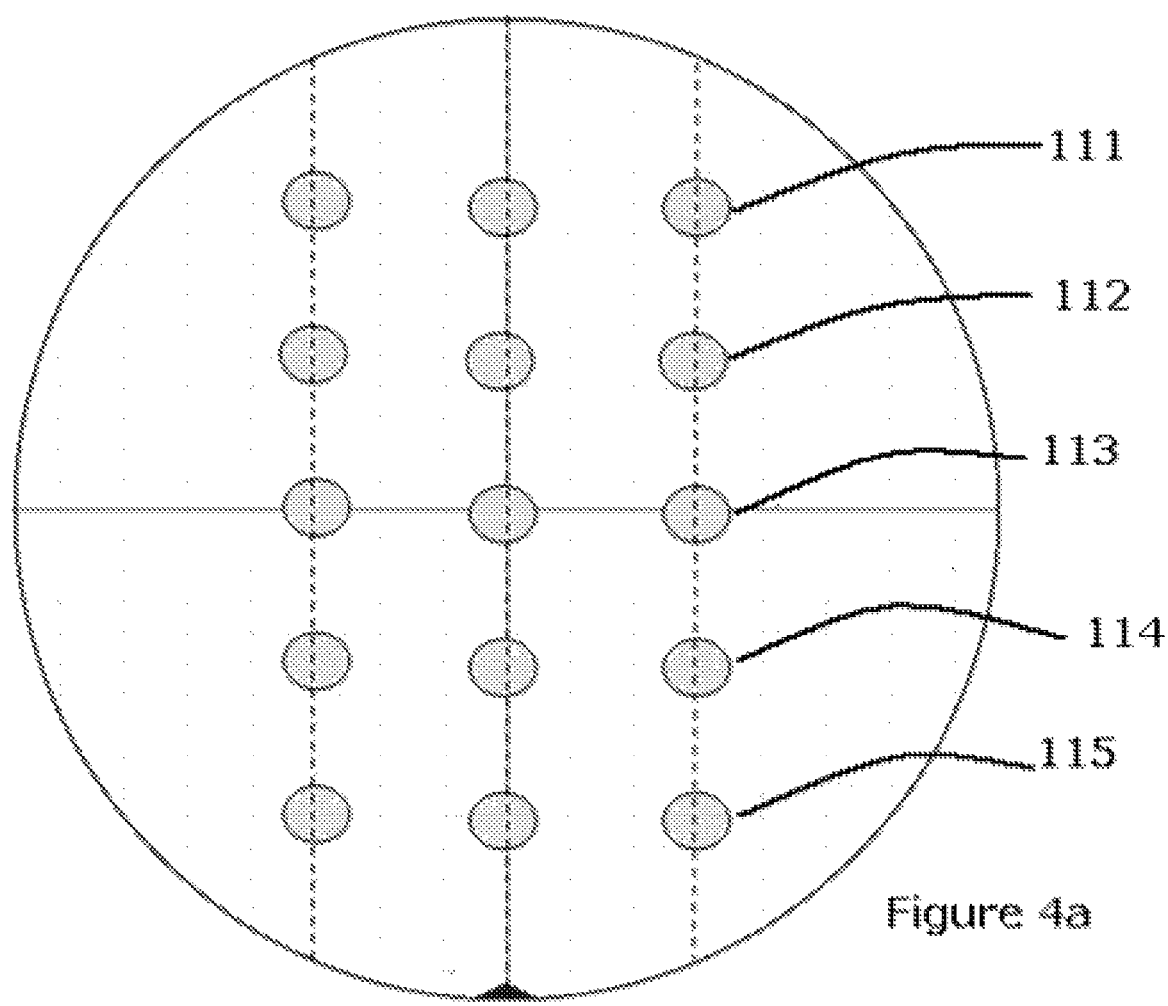
FIG. 4a shows a group of defect clusters sharing the same column topology, according to an embodiment of the present invention.
Figure 4C:
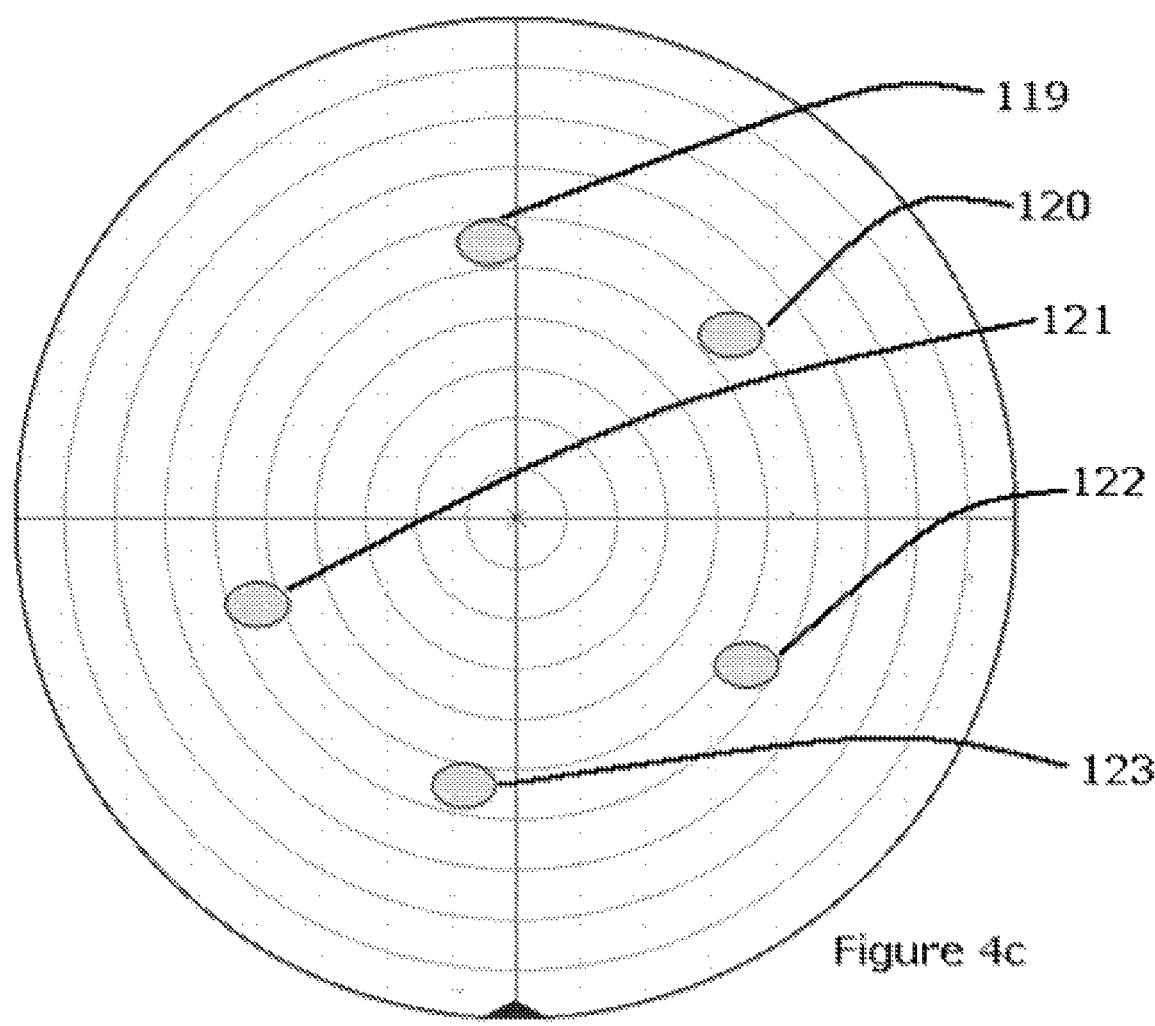
FIG. 4c shows a group of defect clusters sharing the same annular topology, according to an embodiment of the present invention.
Figure 4D:
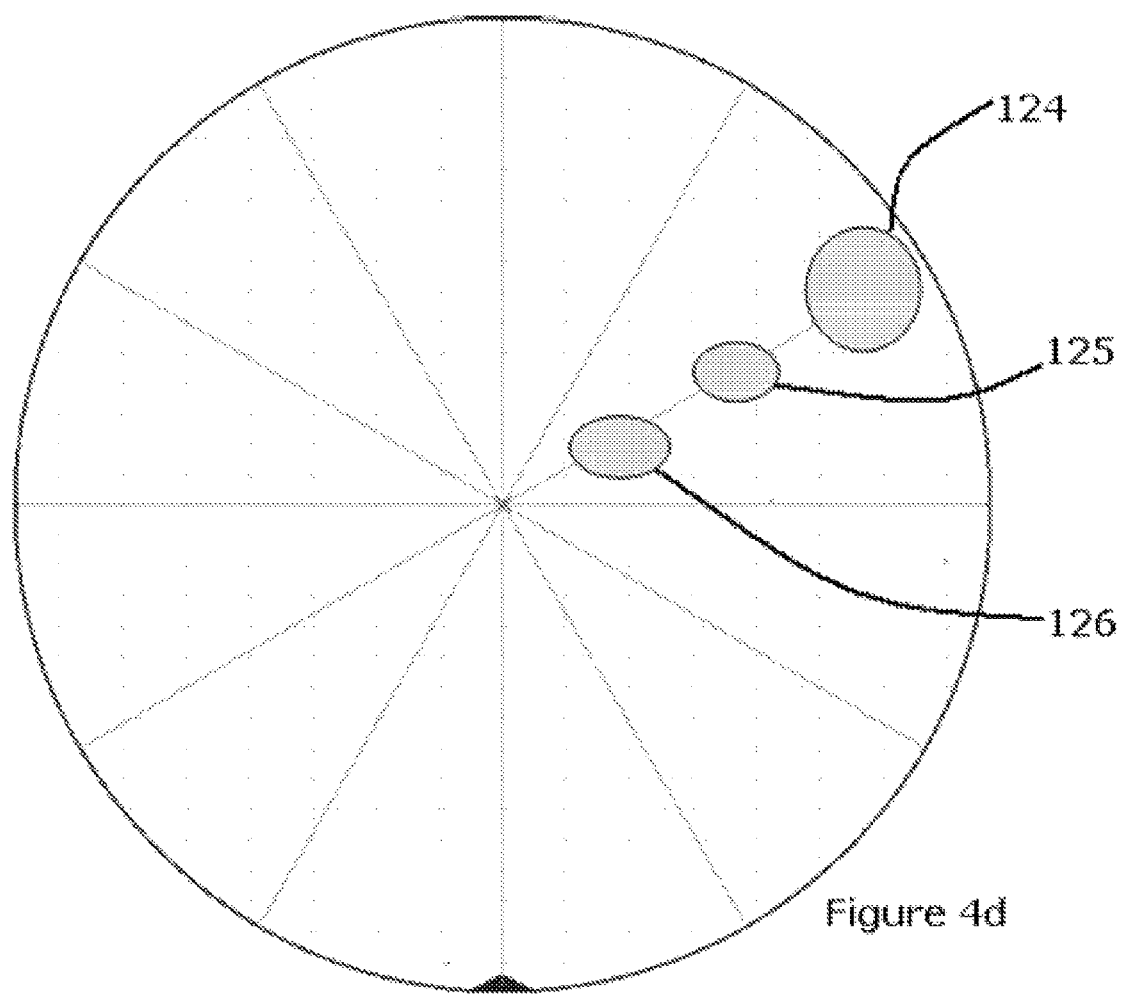
FIG. 4d shows a group of defect clusters sharing the same radial topology, according to an embodiment of the present invention.
Figure 4E:
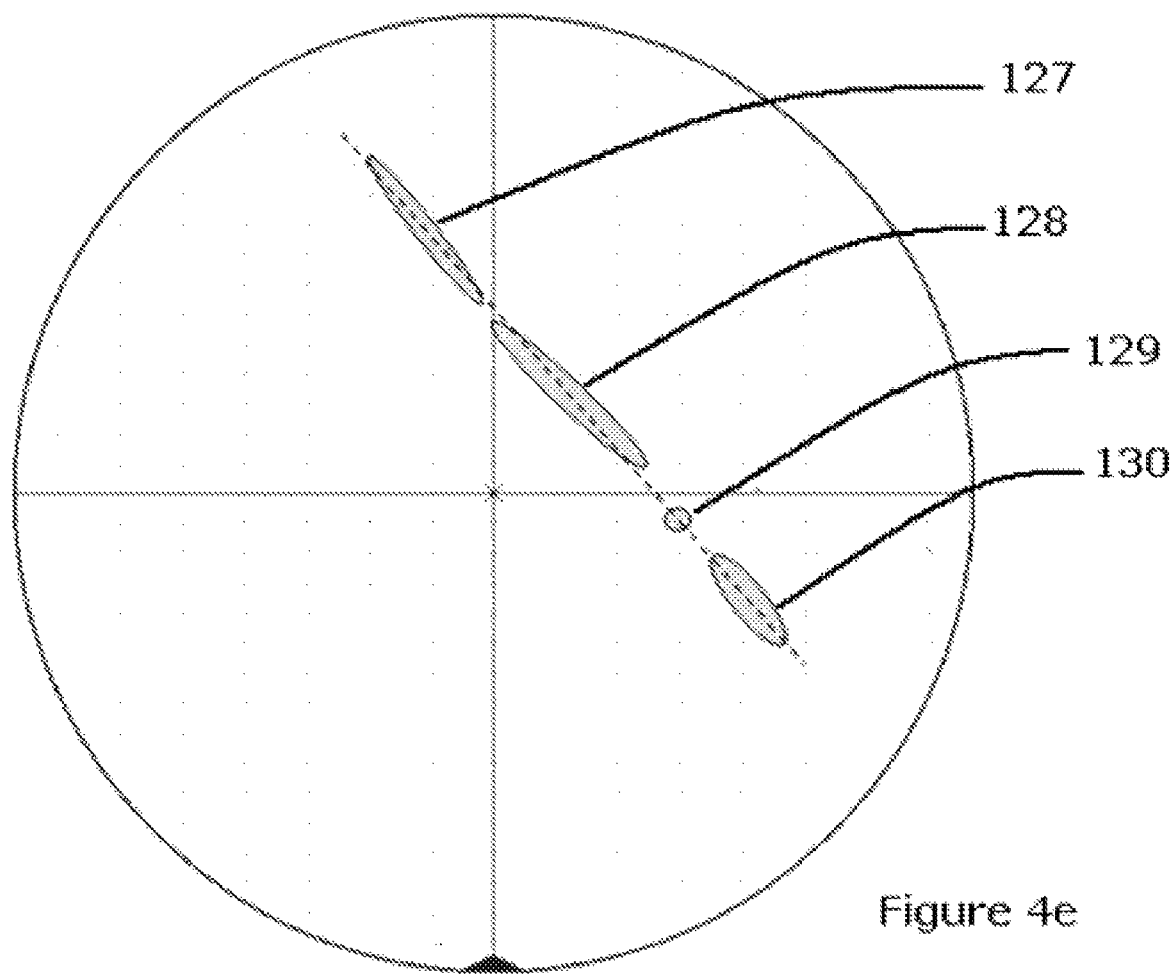
FIG. 4e shows a group of defect clusters sharing the same off-center linear topology, according to an embodiment of the present invention.

FIG. 4a shows examples of defect clusters in which the centroids of the density shape model, or centers of density mass, align along an x-axis in a Cartesian coordinate system, representing examples of clusters forming in column topology. FIG. 4b shows examples of defect clusters in which the centroids of the density shape model, or centers of density mass, align in a y-axis in a Cartesian coordinate, representing examples of clusters forming in row topology. FIG. 4c shows examples of defect clusters in which the centroids form a ring with centers of density mass equidistant from the center of the wafer and with the spines tangential to the ring, representing examples of annular defect clusters forming in annular topology. FIG. 4d shows examples of defect clusters in which the centroids form along a radius of the wafer and the orientation of the spines are on the same axis as the radius, representing radial defect clusters forming in radial topology. FIG. 4e shows examples of scratch defect clusters in which the spines of the density shape model are coincident within a specified tolerance with a line connecting the centroids of the same density shape models, representing examples of patterned scratch clusters forming in off-center linear topology. FIG. 4f shows examples of defect clusters which spiral out from the center of wafer, which is based on the change of rotational speed as a function of sweep angle and the distance of the center of the mass to the center of the wafer, representing examples of spiral clusters forming in spiral topology. When two or more clusters meet one or more of the topology conditions specified by the user, those clusters may be further combined into a complex cluster, which may be also be described by a density shape model with corresponding spatial attributes.

Step 206 allows the user to review the features generated by steps 204 and 205 to and apply a tolerance value for one or more features. For example, the user may apply a 100 micron tolerance value against the trained model's length of the spine which is 1000 microns. That means that clusters with a spine greater than 900 microns and less than 1100 microns will satisfy the rule.

Present embodiments perform pattern recognition using the broad class of if-then rules for classification of defect clusters defined in steps 207 and 208 and stored in a library 300. A very simple example of an if-then rule is as follows:

IF (SpineLength(x)>2000 microns) AND (Width(x)
 <10 microns) THEN ThinScratch(x)

This means that if the density shape model defined by a defect cluster x has a spine length greater than 2000 microns and a width less than 10 microns, then it is declared to be a thin scratch. A predicate, such as IsObjectOrthogonal, comprises a test that returns a value of logical True or False. A function, such as SpineLength(x), comprises a test that returns a numerical value as illustrated above. If-then rules can incorporate predicates as well as functions. Step 200 describes learning such if-then rules.

Figure 3:
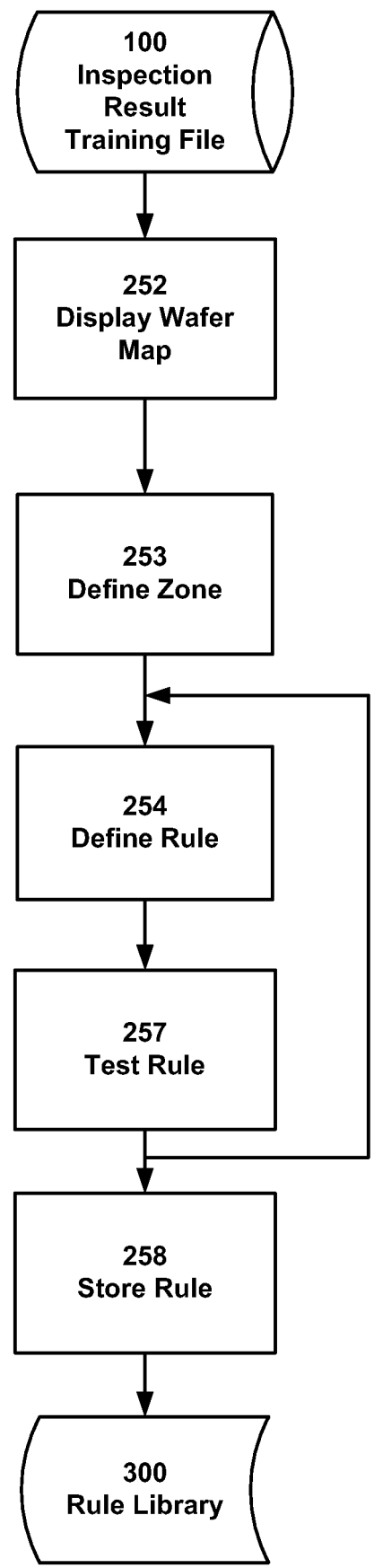
FIG. 3 is a flow diagram illustrating a method for zonal analysis and the rule creation, according to an embodiment of the present invention.
Figure 3A:
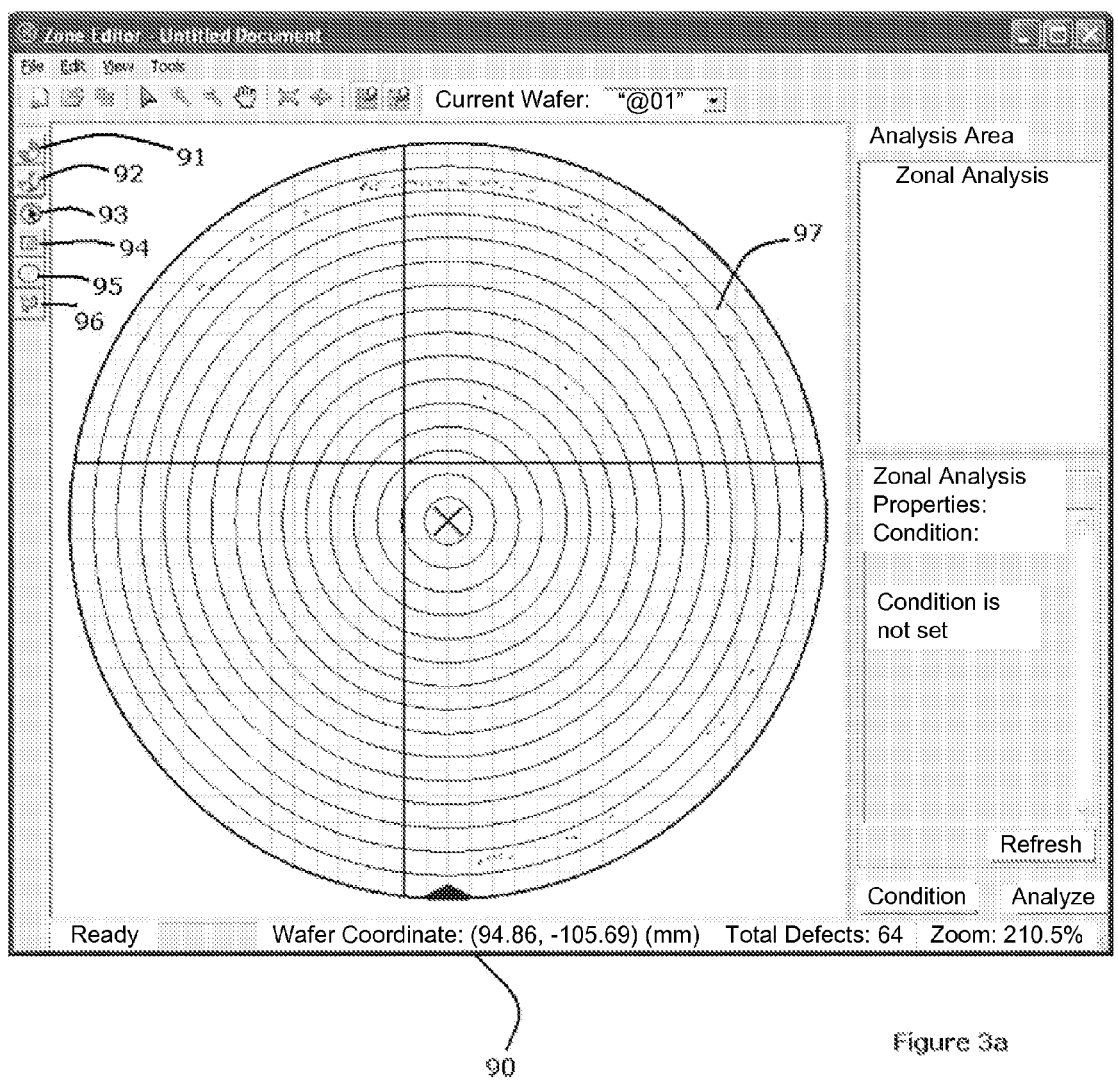
FIG. 3a shows a graphical user interface for a zone editor tool used to define a zone in the wafer defect map analysis and classification, according to an embodiment of the present invention.

FIG. 3 is a flow diagram illustrating a method for zonal analysis and rule extraction for step 250. The rule extraction process 250 is described in terms of a graphical user interface, operating within a graphical computer operating system. Step 252 displays a wafer defect map with ring or annular type defects used for learning such if-then rules. Step 253 allows a user, using a pointing device or equivalent device, to draw the boundary of a zone used for training such if-then rules. FIG. 3a shows a graphical user interface of a zone editor 90 with annular defect cluster of rings 97 superimposed on the defects, according to an embodiment of the present invention. The zone editor 90 comprises one or more of the following tools to define or draw a zone over the wafer defect map:
 a) Quadrants 91
 b) Pie sections 92
 c) Rings 93
 d) Rectangles 94
 e) Ellipses 95
 f) Polygons 96

The zonal analysis focuses on pattern recognition of zonal defect clusters using if-then rules for classification of a defect zone or multiple zones, defined in steps 254, 257, 258 and stored in a library 300.

A very simple if-then rule example to define an annular defect cluster comprises:

IF (PercentageOfZoneDefectsOverTotalWaferDefects
 (x)>70) AND (PercentageOfDefectiveDies-
 OverTheTotalDiesInZone(x)>30) THEN TRUE This means that if a defined zone x has a percentage of defects over the total defects of the wafer greater than 70% and the defective dies percentage in the zone is greater than 30%, then it is an annular defect cluster. If-then rules can incorporate predicates or functions and arithmetic expressions. Step 250 describes the learning of such if-then rules.

Step 400 may be deployed in automated defect classification. The rules stored in the library 300 can be used to classify spatial defect clusters during the fabrication of wafers, by taking an inspection results file and applying the clustering and if-then rules to determine whether there are any defect combinations within the inspection results file that match the rules specified in the signature library.

To increase the reliability of classification step 400, a feedback loop 500 is incorporated to allow the user to optimize the rule or to feedback defect clusters that have been misclassified by previous rules.

While the above techniques have been described with reference to analyzing a single wafer, these signature analysis techniques can also be applied to die/reticle stacks from a large number of wafer inspection files. This represents an application of the above described signature analysis to the field of design for manufacturing (DFM).

One of the objectives of DFM software is to provide feedback from the manufacturing process to the design engineer. For example, a chip designer may be interested in analyzing "hot spots," those areas of the device that contain a disproportionately high number of wafer inspection defects. Some of these hot spots may result from a chip design that is particularly difficult to manufacture. To obtain this type of information, a large volume of wafer inspection data needs to be processed. Existing DFM software typically create a die stack from large numbers of wafer inspection files, and use a thresholding function to determine the location of single points that have a high percentage of defects. These points may then be overlaid onto the design data. As the threshold is lowered, an increasing number of points exceed the threshold, making it more difficult to analyze.

In addition to single point failures, there may be other larger systematic defect distributions of interest that can best be identified using the above described techniques of spatial signature analysis (SSA). In these cases, the single point defect densities of the distribution may not exceed the threshold; however, the spatial attributes of the distribution may allow it to be identified.

The SSA software overlays the dies or reticles from a large number of wafer inspection levels, and uses die or reticle object analysis to identify specific object signatures that are of interest to the design engineer. These objects can then be converted to the same format as the design data so that they can be directly overlaid on the design data. In this way the designer can more easily identify systematic distributions of interest.

Identifying the die stack or reticle stack cluster follows the above described steps 203, 204 and 205. Instead of examining a wafer map to identify a signature (in step 203), the user examines a die stack or reticle stack. In step 204, the user views the die or reticle stack while trying one or more combinations of density and distance parameters in order to capture desired stack clusters. Rules are extracted in the same fashion as with a wafer map. Once defects in the die or reticle stack cluster are identified, they can be put back into their original locations on the wafer map or, in the case of DFM analysis, they can be incorporated into the design files.

In addition to overlaying the defects from an entire die or reticle, it may be to possible to create a mask that only analyzes defects that occur on a particular region of the die. Similarly, die or reticle object analysis can be performed on this data to identify systematic defect distributions of interest.

While certain exemplary embodiments have been described and shown in the accompanying drawings, it is to be understood that such embodiments are merely illustrative and not restrictive of the broad invention and that this invention is not limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

We claim:

1. A method for generating rules for automatic sourcing of substrate microfabrication defects, comprising:

displaying a wafer map, with a target defect cluster and a grid superimposed on the wafer map;

receiving from a user a set of parameters for defining a set of primitive clusters, using the displayed wafer map, wherein said parameters comprise the maximum allowable distance between grid cells in the same primitive cluster, in which said grid cells contain at least one defect;

selecting a geometric shape to represent said set of primitive clusters;

generating a set of density shape models of said selected geometric shape for the set of primitive clusters defined by the primitive cluster parameters received from the user, the density shape models representing mathematical approximations of the defect distribution and density characteristics of the set of primitive clusters, wherein said density shape models are descriptive of said defect cluster in terms of said geometric shape's shape, size, orientation, and location on said wafer map; and receiving from a user a set of spatial parameters for said density shape model that describe the selected geometric spatial parameters of a defect target cluster associated with said shape's shape, size, orientation, and location on said wafer map, wherein said spatial parameters for said geometric shape corresponds to a known physical event that deposits or causes to form defects on a substrate in the microfabrication process.

2. The method of claim 1, wherein the set of parameters for defining a set of primitive clusters includes the total number of defects in the primitive cluster.

3. The method of claim 2, wherein the set of parameters for defining a set of primitive clusters further includes a minimum number of defects in a grid cell of the primitive cluster.

4. The method of claim 2, further comprising:

specifying a set of rules, using spatial attributes of the density shape models, to capture the primitive clusters which the user considers part of the target defect cluster.

5. The method of claim 4, wherein the set of rules express a grouping of a plurality of primitive clusters into a set of one or more combined clusters that captures the target defect cluster that corresponds to a known physical event that deposits or causes to form defects on a substrate in the microfabrication process.

6. The method of claim 5, further comprising:

generating a higher level set of density shape models for the combined clusters; and allowing the user to generate a higher level set of rules, using spatial attributes of the higher level density shape models of the combined clusters, thereby allowing the user to further combine combined clusters in order to better capture the target defect cluster that corresponds to a known physical event that deposits or causes to form defects on a substrate in the microfabrication process.

7. The method of claim 1, wherein a die stack or a reticle stack is used in lieu of the wafer map.

8. The method of claim 2, wherein a die stack or a reticle stack is used in lieu of the wafer map.

9. The method of claim 3, wherein a die stack or a reticle stack in used in lieu of the wafer map.

10. A method for generating rules for automatic sourcing of substrate microfabrication defects, comprising:

displaying a wafer map and superimposing a grid thereon;

drawing a boundary around a defect cluster, wherein said drawing is performed by a user;

assigning values to one or more parameters such that the values define a set of grid cells which comprise defects and approximate the drawn boundary, wherein said parameters comprise defect density, distance between adjacent defects, and one or more geometric shape;

fitting a geometric density shape model to the set of grid cells; and generating an if-then rule for recognizing the defect cluster, the rule comprising the assigned values and one or more attributes of the geometric density shape model, wherein said rule further comprises a shape, size, orientation, and location of said geometric density shape model.

11. The method of claim 10, wherein the parameters comprise (a) minimum defects per cell density and (b) allowable distance between cells.

12. The method of claim 11, wherein the parameters further comprise (c) a minimum or maximum number of grid cells per cluster.

13. The method of claim 10, wherein the assigning further comprises searching for values which approximate the cluster within the drawn boundary.

14. The method of claim 13, wherein the searching comprises iteratively increasing the minimum defects per cell, and iteratively decreasing the allowable distance between cells, until the set of grid cells approximates the drawn boundary.

15. The method of claim 10, wherein the geometric density shape model comprises an ellipse, a curved tube, a rectangle, or a polygon.

16. The method of claim 10, wherein the fitting is based on a center of gravity and density distribution of the defects.

17. The method of claim 10, wherein the one or more attributes of the geometric density shape model comprise a centroid, a spine, a spine curvature, a cross section width, a cross section symmetry, or a change of cross section as a function of sweep.

18. The method of claim 10, wherein a die stack or reticle stack is used in lieu of the wafer map.

19. A method for applying rules for automatic sourcing of substrate microfabrication defects, comprising:

superimposing a grid on a set of wafer defects indicated by a results file;

applying an if-then rule to the results file to determine one or more defect clusters in the set of wafer defects, the rule comprising values assigned to one or more parameters;

fitting a geometric density shape model to the defect clusters determined by the if-then rules, using geometric parameters provided by the user, the fitting resulting in one or more density shape model attributes; and looking up the density shape model attributes in a library of signatures;

comparing said signatures to said geometric density shape model, thereby enabling determination of substrate microfabrication defect source.

20. The method of claim 19, wherein the parameters comprise (a) minimum defects per cell density and (b) allowable distance between cells.

21. The method of claim 20, wherein the parameters comprise (c) a minimum or maximum number of grid cells per cluster.

22. The method of claim 19, wherein the geometric density shape model comprises an ellipse, a curved tube, a rectangle, or a polygon.

23. The method of claim 19, wherein the one or more attributes of the geometric density shape model comprise a centroid, a spine, a spine curvature, a cross section width, a cross section symmetry, or a change of cross section as a function of sweep.

24. The method of claim 19, further comprising:

arbitrating between signatures when a testing step results in more than one signature match.

25. The method of 19, wherein the applying step is restricted to defects within a particular wafer region.

26. The method of claim 19, wherein the wafer defects represent defects of a stacked set of dies or a stacked set of reticles.

* * * * *